(12) United States Patent
Paudel et al.

(10) Patent No.: US 11,588,306 B2
(45) Date of Patent: Feb. 21, 2023

(54) SWITCHGEAR

(71) Applicant: Mitsubishi Electric Corporation, Tokyo (JP)

(72) Inventors: Saroj Paudel, Tokyo (JP); Katsunori Kawanishi, Tokyo (JP); Naoaki Inoue, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 133 days.

(21) Appl. No.: 16/767,458

(22) PCT Filed: Dec. 7, 2017

(86) PCT No.: PCT/JP2017/044022
§ 371 (c)(1),
(2) Date: May 27, 2020

(87) PCT Pub. No.: WO2019/111378
PCT Pub. Date: Jun. 13, 2019

(65) Prior Publication Data
US 2020/0412108 A1 Dec. 31, 2020

(51) Int. Cl.
*H02B 13/025* (2006.01)
*H05K 5/02* (2006.01)

(52) U.S. Cl.
CPC ......... *H02B 13/025* (2013.01); *H05K 5/0213* (2013.01); *H05K 5/0217* (2013.01)

(58) Field of Classification Search
CPC .. H02B 13/025; H05K 5/0213; H05K 5/0217; H05K 7/20145; H01H 33/53; H01H 33/56
See application file for complete search history.

(56) References Cited

U.S. PATENT DOCUMENTS 4,461,499 A * 7/1984 Hunter ............... F24F 13/0209
285/364
4,976,114 A * 12/1990 Manning ............. F16F 3/087
165/48.1
(Continued)

FOREIGN PATENT DOCUMENTS

GB 2526149 A * 11/2015 .......... F24F 13/0209
JP S5887406 U 6/1983
(Continued)

OTHER PUBLICATIONS

Kozuru, Susumu; Kobayashi, Hirotsugu; Sano, Koji, "Switch Gear", Sep. 2, 2010, Mitsubishi Electric Corporation, Entire Document (Translation of WO 2010097911). (Year: 2010).*

(Continued)

*Primary Examiner* — Stephen S Sul
(74) *Attorney, Agent, or Firm* — Buchanan Ingersoll & Rooney PC

(57) ABSTRACT

At a connection portion between a common duct penetrating in an arrangement direction through switchgears arranged in the arrangement direction inside an electrical room, and an exhaust duct via which the common duct and outside of the electrical room communicate with each other, an end of the common duct is bent inward to form a first exhaust duct joining portion, and an end of the exhaust duct is bent outward to form a common duct joining portion. In a state in which an outer surface of the first exhaust duct joining portion and an inner surface of the common duct joining portion are in contact with each other, the first exhaust duct joining portion and the common duct joining portion are fastened and fixed by two or more pairs of bolts and welding nuts.

14 Claims, 13 Drawing Sheets

(56) References Cited

U.S. PATENT DOCUMENTS

| | | | | |
|---|---|---|---|---|
| 2006/0050470 A1* | 3/2006 | Eiselt | .................... | H02B 13/025 361/605 |
| 2011/0299226 A1* | 12/2011 | Milovac | ................. | H02B 11/00 361/605 |
| 2014/0118887 A1* | 5/2014 | Deb | ..................... | H02B 13/025 361/622 |
| 2014/0133071 A1* | 5/2014 | Gingrich | ................ | H02B 1/565 361/678 |
| 2017/0256922 A1* | 9/2017 | Rajauria | .............. | H02B 13/025 |
| 2018/0352667 A1* | 12/2018 | Boily | ................... | H02B 13/045 |

FOREIGN PATENT DOCUMENTS

| | | | | |
|---|---|---|---|---|
| JP | S62132609 U | 2/1987 | | |
| JP | S6250448 U | 3/1987 | | |
| JP | S62145407 U | 9/1987 | | |
| JP | H08191510 A | 7/1996 | | |
| JP | 2006050796 A | 2/2006 | | |
| JP | 2008064354 A | 3/2008 | | |
| JP | 3155105 U | 11/2009 | | |
| WO | WO-2010097911 A | * | 9/2010 | ............ H02B 13/02 |
| WO | WO-2014137336 A1 | * | 9/2014 | ........... H02B 13/025 |

OTHER PUBLICATIONS

International Search Report (with English Translation) and Written Opinion issued in corresponding International Patent Application No. PCT/JP2017/044022, 9 pages (dated Feb. 20, 2018).

Office Action dated May 6, 2021, issued in corresponding Chinese Patent Application No. 201780097214.7, 16 pages including 8 pages of English translation.

* cited by examiner

SWITCHGEAR

TECHNICAL FIELD

The present invention relates to a switchgear having a pressure release structure for discharging high-temperature high-pressure gas generated upon an arc fault or an internal short-circuit fault, to outside.

BACKGROUND ART

When an arc fault or an internal short-circuit fault occurs in a switchgear, high-temperature high-pressure gas is generated inside the switchgear. Such high-temperature high-pressure gas is required to be prevented from leaking to the surroundings of the switchgear. Therefore, in general, a housing of the switchgear is configured to have sufficient airtightness and rigidity and also is provided with a pressure release structure for discharging the high-temperature high-pressure gas to outside to release the pressure. In one conventional example, a bellows-structure passage which moves to the front side by abnormal pressure inside a bus chamber is provided at the front surface of a bus chamber pressure release plate, and the passage is pushed and expanded by the pressure of gas generated in the case of short-circuit, whereby a discharge path for the gas is ensured (see, for example, Patent Document 1).

In another example, a pressure release panel in which the space is partitioned at the center along a direction perpendicular to a side wall of a switchboard and the partitioned compartments each have a pressure release hole, is attached to the side wall of the switchboard. The partitioned compartments of the pressure release panel respectively communicate with a circuit breaker chamber and a load cable chamber of the switchboard. Thus, no matter where an arc generation fault occurs in the switchboard, it is possible to release the pressure without influencing the other compartment (see, for example, Patent Document 2).

In still another example, a housing the inside which is partitioned into an intake chamber to which an intake duct is connected and an exhaust chamber to which an exhaust duct is connected, is interposed between a pair of switchboards. Lower parts of the paired switchboards communicate with the intake chamber, and upper parts thereof communicate with the exhaust chamber. Then, air warmed by cooling a transformer or the like is discharged to outside via the exhaust duct (see, for example, Patent Document 3).

CITATION LIST

Patent Document

Patent Document 1: Japanese Laid-Open Patent Publication No. 8-191510
Patent Document 2: Japanese Laid-Open Utility Model Publication No. 58-87406
Patent Document 3: Japanese Laid-Open Utility Model Publication No. 62-132609

SUMMARY OF THE INVENTION

Problems to be Solved by the Invention

However, when the bellows structure passage is pushed and expanded as in the configuration of Patent Document 1, strength reduction due to deformation occurs at the bellows part and thus there is a possibility that airtightness cannot be ensured. In addition, it is necessary to assuredly prevent high-temperature high-pressure gas from leaking at an unintended part in the case of an arc fault or an internal short-circuit fault, and thus a discharge path for the high-temperature high-pressure gas is required to have high airtightness. Therefore, in particular, it is necessary to ensure airtightness at a connection portion between the ducts. In this regard, Patent Document 2 discloses nothing about a connection part between the pressure release panel and the switchboard, and Patent Document 3 discloses nothing about a connection part between the exhaust duct and the exhaust chamber. In the case of using general bolt connection, a gap is formed between a plate of the duct and a bolt, so that sufficient airtightness might not be ensured.

The present invention has been made to solve the above problems, and an object of the present invention is to obtain a highly reliable switchgear that ensures airtightness of a discharge path for high-temperature high-pressure gas generated upon an arc fault or an internal short-circuit fault.

Solution to the Problems

The present invention is a switchgear including switchgears which are arranged in an arrangement direction inside an electrical room and each of which has a plurality of compartments therein, including: a first duct which penetrates through the switchgears in the arrangement direction and communicates with each of the plurality of compartments via a pressure release duct; and a second duct via which the first duct and outside of the electrical room communicate with each other. At a connection portion between the first duct and the second duct, an end of the first duct is bent inward to form a first joining portion. At a connection portion between the first duct and the second duct, an end of the second duct is bent outward to form a second joining portion. In a state in which an outer surface of the first joining portion and an inner surface of the second joining portion are in contact with each other, the first joining portion and the second joining portion are fastened and fixed by two or more pairs of fastening members.

Effect of the Invention

The present invention makes it possible to obtain a highly reliable switchgear that ensures airtightness of a discharge path for high-temperature high-pressure gas generated upon an arc fault or an internal short-circuit fault.

DESCRIPTION OF EMBODIMENTS

Embodiment 1

Figure 1:
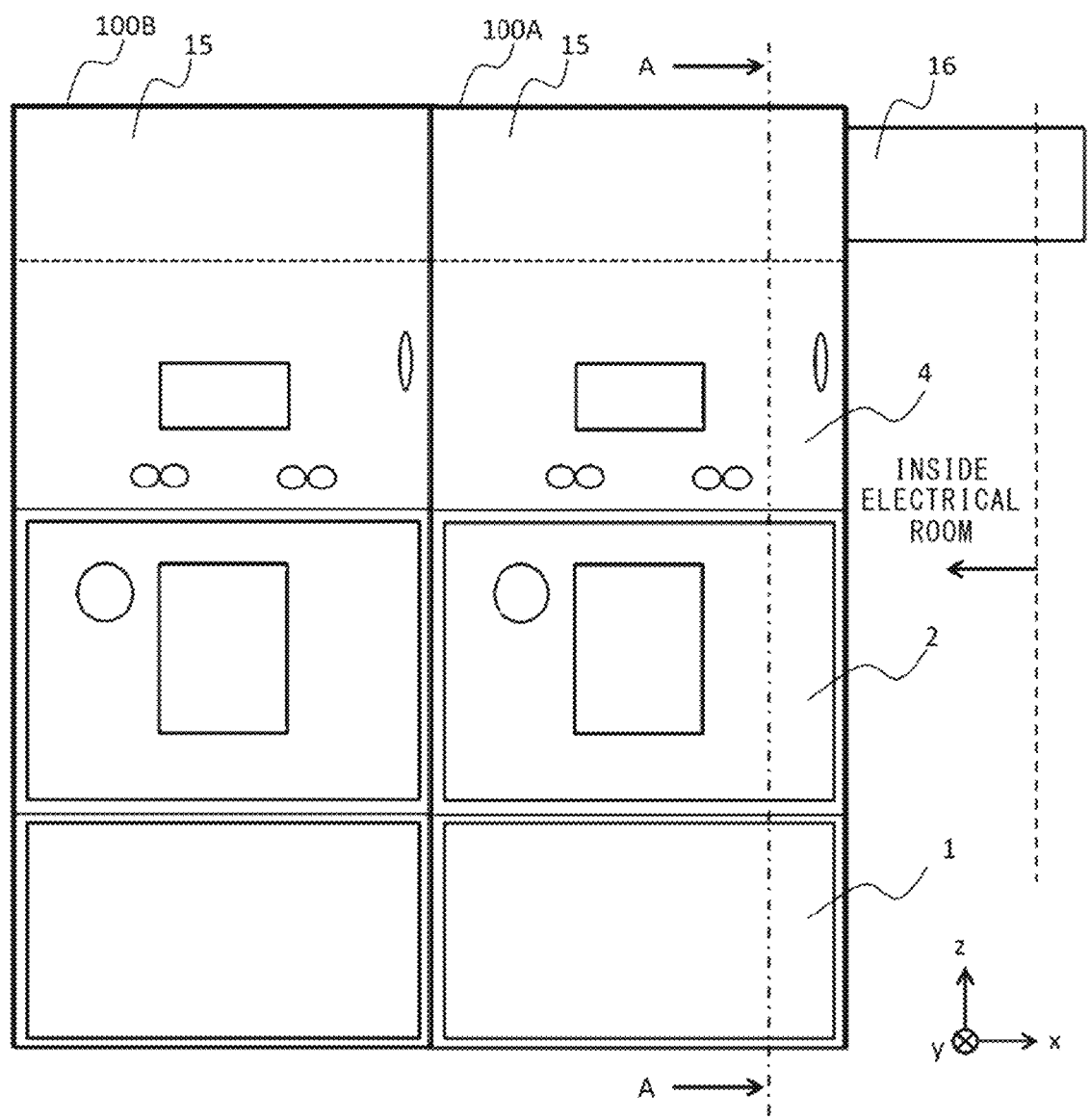
FIG. 1 is a front view showing switchgears according to embodiment 1 of the present invention.
Figure 2:
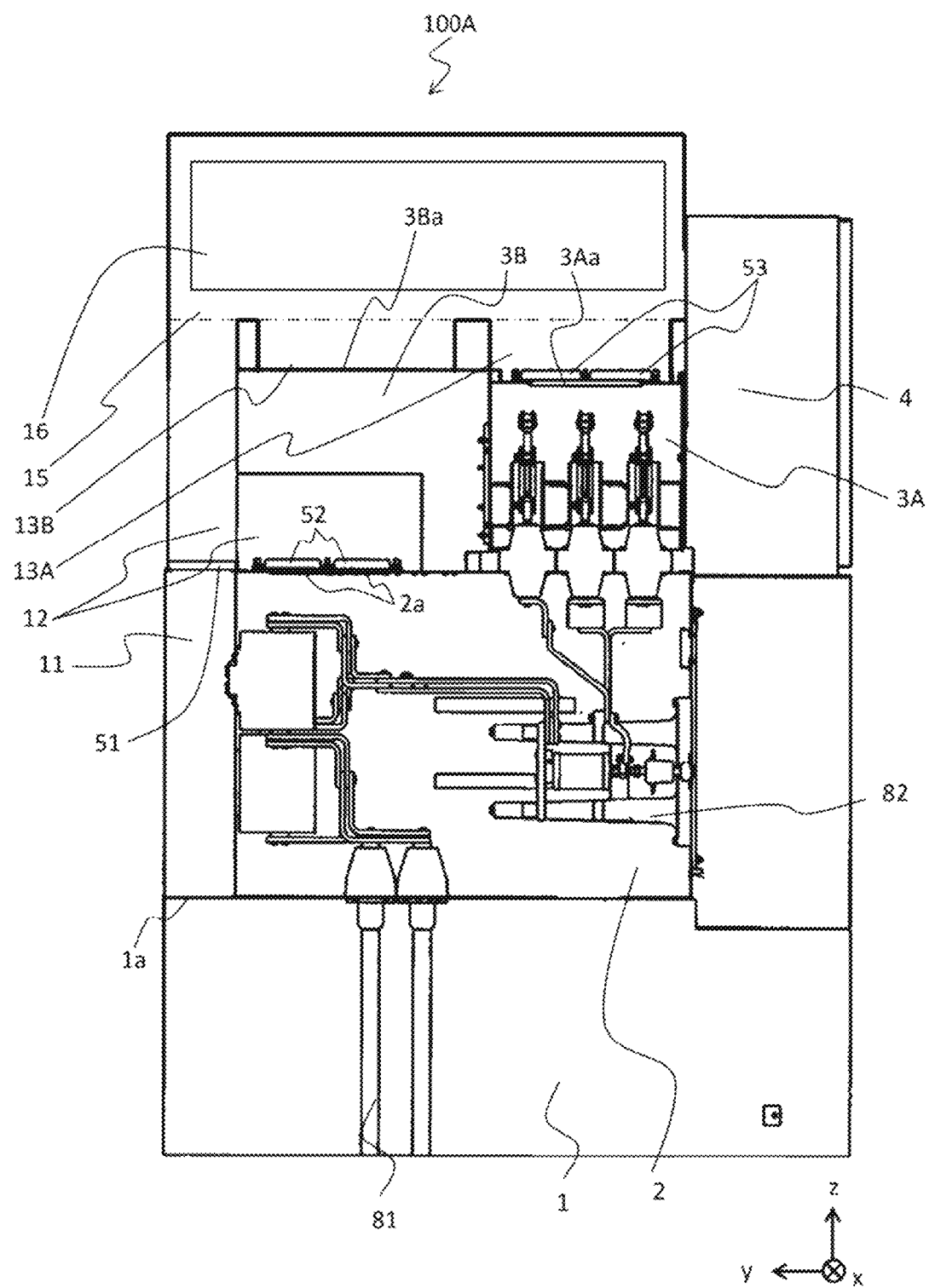
FIG. 2 is a sectional view along line A-A in FIG. 1 and is a side sectional view of the switchgear according to embodiment 1.

Hereinafter, embodiment 1 of the present invention will be described with reference to FIG. 1 to FIG. 11. FIG. 1 is a front view showing switchgears according to embodiment 1, and FIG. 2 is a sectional view along line A-A in FIG. 1 and is a side sectional view of a switchgear 100A shown in FIG. 1. The switchgear according to the present invention includes a plurality of switchgears arranged in a predetermined arrangement direction inside an electrical room, and in the drawings, the arrangement direction of the switchgears is defined as x-direction, the direction from the front side toward the rear side of the switchgears is defined as y-direction, and the vertical direction is defined as z-direction. In FIG. 1, the switchgear located at the end of the arrangement is defined as switchgear 100A, and the other switchgear is defined as switchgear 100B. The inside of each switchgear 100A, 100B has a plurality of compartments formed by partition plates. In embodiment 1, a cable chamber 1 storing voltage cables 81 extending in the z-direction is provided at the lower stage, and a circuit breaker chamber 2 storing a circuit breaker 82 having a vertically-two-stage structure is provided at the middle stage. At the upper stage, a control chamber 4 storing a control circuit (not shown) for controlling various devices, and a front bus chamber 3A and a rear bus chamber 3B each storing three-phase buses, are arranged in this order from the front side. The rear bus chamber 3B has an inverted-L-shaped cross section, and at a part of an under area, a space where a circuit breaker chamber pressure release duct 12 described later is placed is formed. It is noted that the compartment arrangements are not limited to the above arrangements. The compartment arrangements may be different between the switchgear 100A and the switchgear 100B.

Common ducts 15 (i.e., first duct) penetrating through the switchgear 100A and the switchgear 100B in the x-direction are provided above the front bus chamber 3A and the rear bus chamber 3B. The common ducts 15 provided in the switchgear 100A and the switchgear 100B are connected to form one duct penetrating through the entire arranged switchgears. The electrical-room-outward end of the common duct 15 of the switchgear 100A is connected to an exhaust duct 16 (i.e., second duct). The exhaust duct 16 extends to the outside of the electrical room, and the outside of the electrical room and the common duct 15 communicate with each other via the exhaust duct 16.

A partition plate between the cable chamber 1 and the middle-stage compartment has an opening 1a, and the partition plate between the circuit breaker chamber 2 and the upper-stage compartment has an opening 2a. Top plates of the front bus chamber 3A and the rear bus chamber 3B have an opening 3Aa and an opening 3Ba, respectively.

A cable chamber pressure release duct 11 extending in the z-direction is provided between the rear surface of the switchgear 100A and the circuit breaker chamber 2. The circuit breaker chamber pressure release duct 12 composed of two parts respectively extending in the x-direction and the z-direction is provided between the rear surface of the switchgear 100A and the rear bus chamber 3B. The circuit breaker chamber 2 and the cable chamber pressure release duct 11 are partitioned by a partition plate, and the rear bus chamber 3B and the circuit breaker chamber pressure release duct 12 are partitioned by a partition plate. The cable chamber pressure release duct 11 has a lower end connected to the cable chamber 1 via the opening 1a, and an upper end connected to the circuit breaker chamber pressure release duct 12. Regarding the circuit breaker chamber pressure release duct 12, a lower end of the part extending in the x-direction is connected to the circuit breaker chamber 2 via the opening 2a, and an upper end of the part extending in the z-direction is connected to the common duct 15. A front bus chamber pressure release duct 13A and a rear bus chamber pressure release duct 13B are provided between the common duct 15, and the front bus chamber 3A and the rear bus chamber 3B. The front bus chamber pressure release duct 13A and the rear bus chamber pressure release duct 13B have lower ends connected to the front bus chamber 3A and the rear bus chamber 3B via the openings 3Aa, 3Ba, respectively, and have upper ends connected to the common duct 15. The front bus chamber pressure release duct 13A and the rear bus chamber pressure release duct 13B are partitioned from each other by a partition plate. As described above, the cable chamber pressure release duct 11, the circuit breaker chamber pressure release duct 12, the front bus chamber pressure release duct 13A, and the rear bus chamber pressure release duct 13B allow the cable chamber 1, the circuit breaker chamber 2, the front bus chamber 3A, and the rear bus chamber 3B to communicate with the common duct 15.

A cable chamber pressure release plate 51 for opening/closing the upper-end opening of the cable chamber pressure release duct 11 is attached at the upper end of the cable chamber pressure release duct 11, and a circuit breaker chamber pressure release plate 52 for opening/closing the opening 2a is attached at the part extending in the x-direction, of the circuit breaker chamber pressure release duct 12. Bus chamber pressure release plates 53 for opening/closing the openings 3Aa, 3Ba are attached at the lower ends of the front bus chamber pressure release duct 13A and the rear bus chamber pressure release duct 13B. It is noted that the bus chamber pressure release plate 53 for opening/closing the opening 3Ba is not shown. The cable chamber pressure release plate 51 opens upward by pressure from the lower side, i.e., the cable chamber side. In the case where high-temperature high-pressure gas is generated in the cable chamber 1, the cable chamber pressure release plate 51 opens upward by the pressure thereof, to release the pressure from the inside of the cable chamber 1, whereas the cable chamber pressure release plate 51 does not open by pressure from the upper side. Similarly, the circuit breaker chamber pressure release plate 52 and the bus chamber pressure release plates 53 respectively open upward by pressure from the circuit breaker chamber 2 side and from the front bus chamber 3A side and the rear bus chamber 3B side, to release the pressure from the inside of the circuit breaker chamber 2 and from the inside of the front bus chamber 3A and the inside of the rear bus chamber 3B, whereas they do not open by pressure from the upper side.

Figure 3:
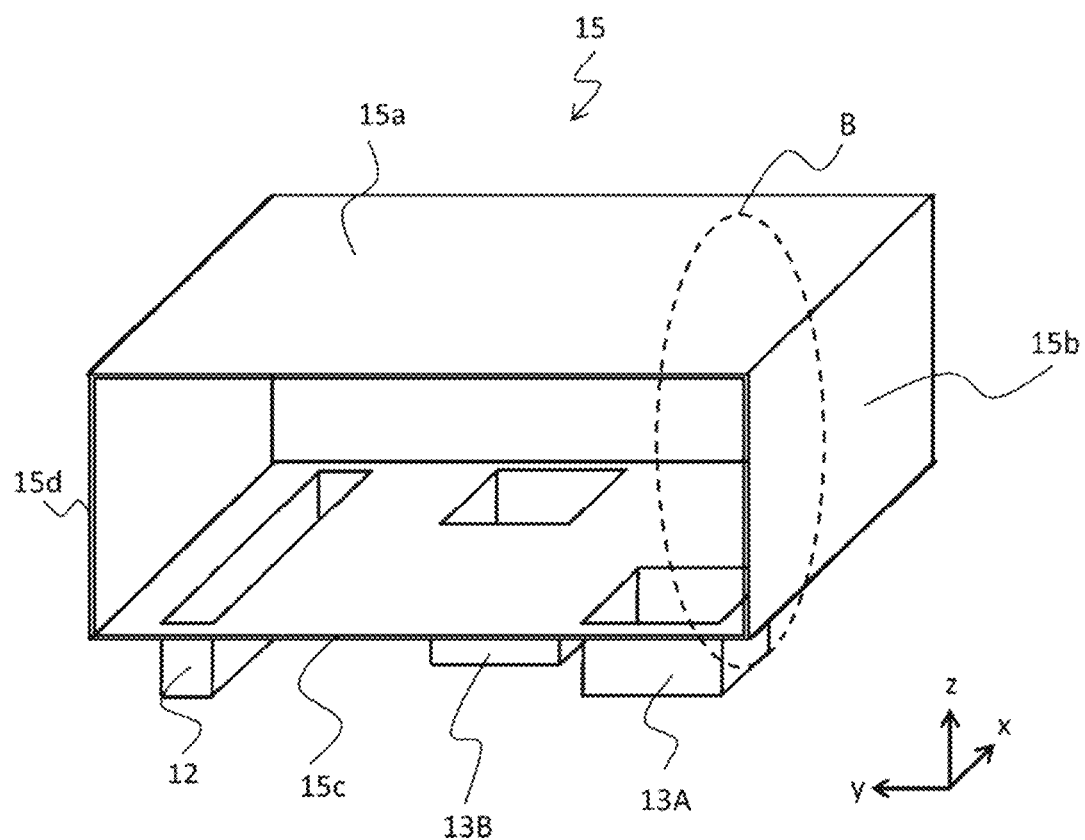
FIG. 3 is a perspective view showing a common duct according to embodiment 1 of the present invention.
Figure 4:
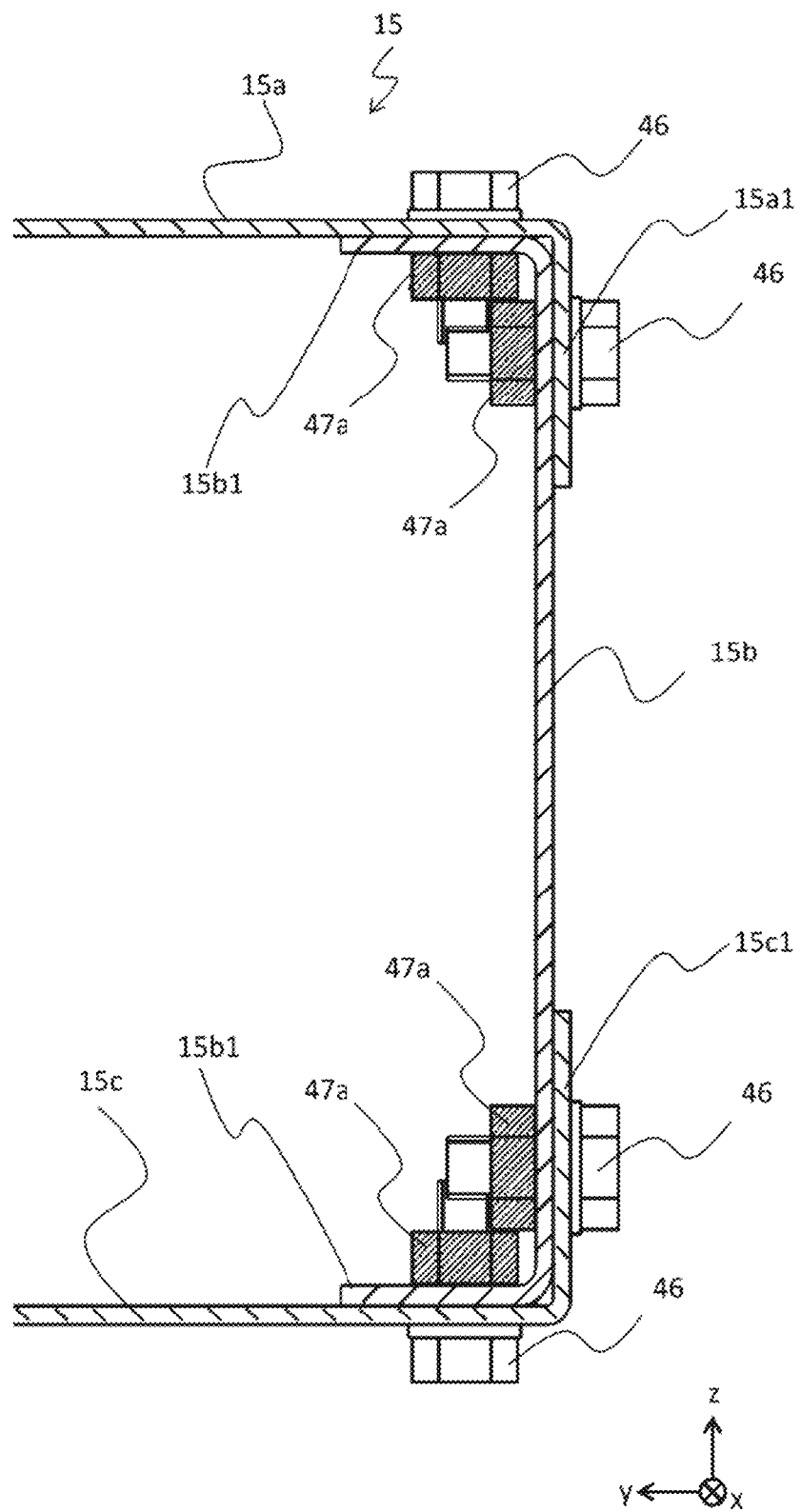
FIG. 4 is a detailed view of part B in FIG. 3 and shows joining portions between a front plate, and an upper plate and a lower plate of the common duct according to embodiment 1.

Next, the structure of the common duct 15 will be described. FIG. 3 is a perspective view showing the common duct according to embodiment 1, and FIG. 4 is a detailed view of part B in FIG. 3 and shows joining portions between a front plate, and an upper plate and a lower plate of the common duct. It is noted that the common duct shown in FIG. 3 and FIG. 4 represents the part penetrating through one switchgear 100A or 100B, of the common ducts penetrating through the plurality of switchgears 100A, 100B that are arranged. The common duct 15 penetrating through the entirety of the plurality of switchgears that are arranged is formed by connecting each common duct 15 shown in FIG. 3.

As shown in FIG. 3, the common duct 15 is composed of an upper plate 15a, a front plate 15b, a lower plate 15c, and a rear plate 15d extending in the x-direction and having side ends joined to each other so as to form a duct having a rectangular sectional shape. The lower plate 15c has openings formed correspondingly for the circuit breaker chamber pressure release duct 12, the front bus chamber pressure release duct 13A, and the rear bus chamber pressure release duct 13B.

The front side ends of the upper plate 15a and the lower plate 15c are respectively bent downward and upward as shown in FIG. 4, to form front plate joining portions 15a1, 15c1. Both upper and lower side ends of the front plate 15b are bent toward the rear side, to form upper and lower plate joining portions 15b1. The front plate joining portion 15a1 and the front plate 15b have bolt holes (not shown) through which bolts 46 are inserted, at mutually corresponding positions. The front plate joining portion 15c1 and the front plate 15b have bolt holes (not shown) through which bolts 46 are inserted, at mutually corresponding positions. On the inner surface side of the front plate 15b, welding nuts 47a are welded at positions corresponding to the bolt holes. The bolts 46 and the welding nuts 47a correspond to fastening members.

Joining between the front plate 15b, and the upper plate 15a and the lower plate 15c, is performed as follows. In a state in which the inner surfaces of the front plate joining portions 15a1, 15c1 are brought into contact with the outer surface of the front plate 15b, the bolts 46 are inserted through in the y-direction from the front plate joining portion 15a1, 15c1 sides, so as to be screwed to the welding nuts 47a welded on the inner surface of the front plate 15b. In addition, in a state in which the outer surfaces of the upper and lower plate joining portions 15b1 are brought into contact with the inner surfaces of the upper plate 15a and the lower plate 15c, the bolts 46 are inserted through in the z-direction from the upper plate 15a side and the lower plate 15c side, so as to be screwed to the welding nuts 47a welded on the inner surfaces of the upper and lower plate joining portions 15b1. Thus, the upper plate 15a and the lower plate 15c, and the front plate 15b, are fastened and fixed. As described above, the front plate 15b, and the upper plate 15a and the lower plate 15c, are joined by their side ends being fastened and fixed in two fastening directions with use of two pairs of fastening members. Here, joining between the front plate 15b, and the upper plate 15a and the lower plate 15c, has been described. The same applies to the case of joining between the rear plate 15d, and the upper plate 15a and the lower plate 15c. In embodiment 1, two pairs of fastening members are used. However, the fastening and fixation only have to be made in two fastening directions using two or more pairs of fastening members. Therefore, three or more pairs of fastening members may be used. Here, the two fastening directions are the y-direction and the z-direction and thus are perpendicular to each other. However, the two fastening directions may be directions crossing each other.

Figure 5:
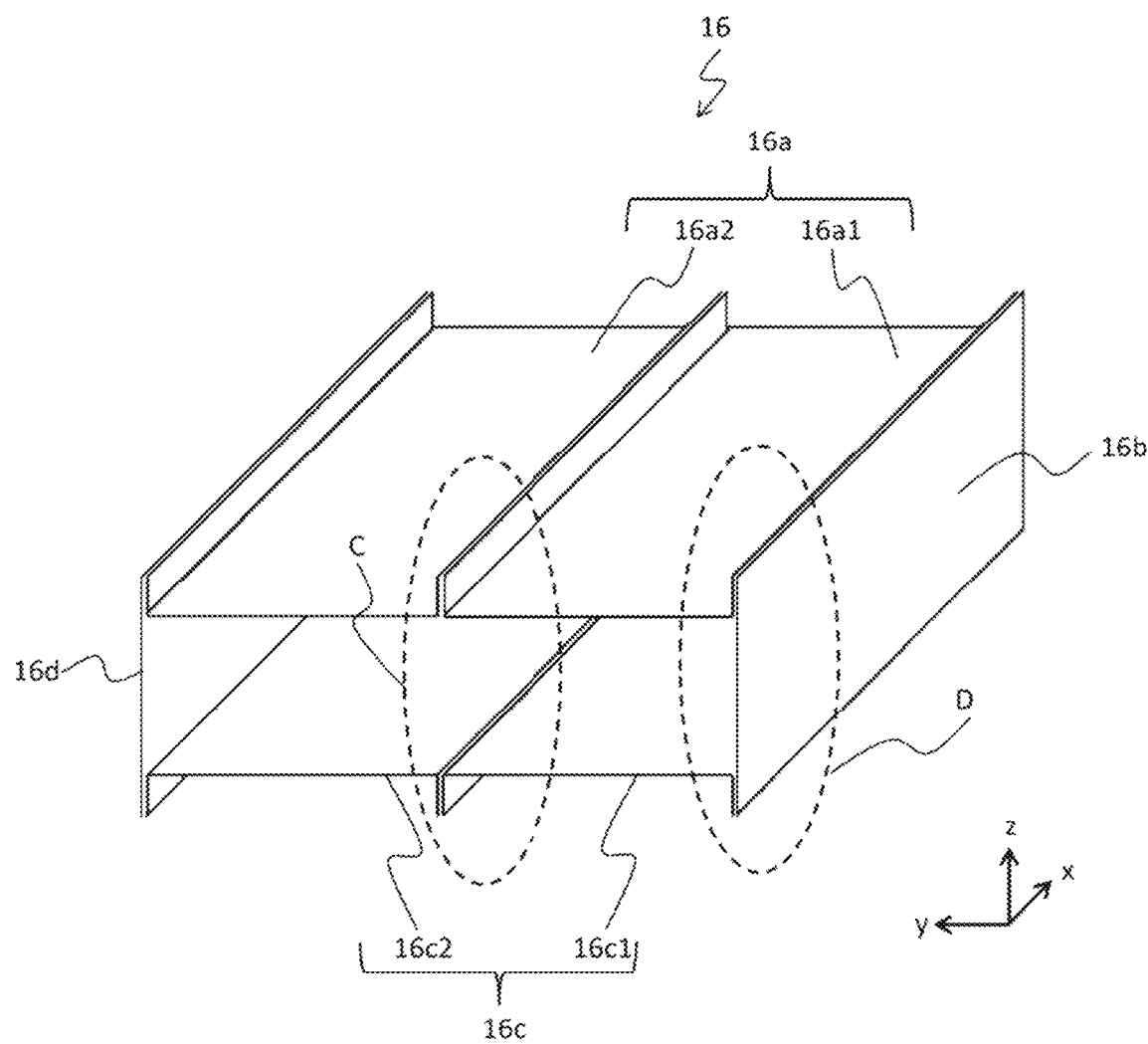
FIG. 5 is a perspective view showing an exhaust duct according to embodiment 1 of the present invention.
Figure 6:
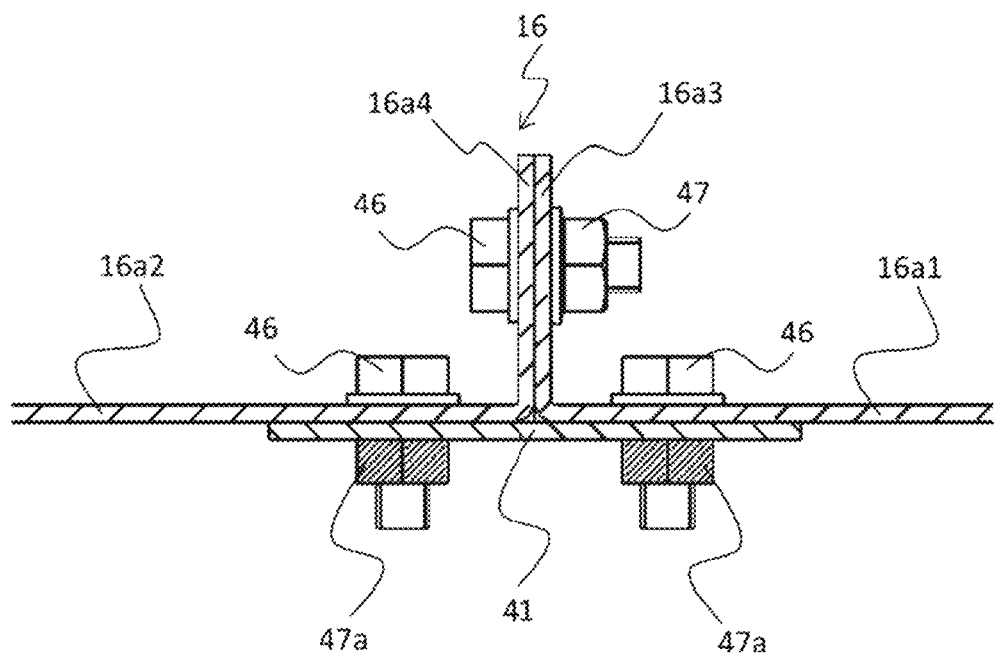
FIG. 6 is a detailed view of part C in FIG. 5 and shows a joining portion between divided upper plates and a joining portion between divided lower plates of the exhaust duct according to embodiment 1.
Figure 6:
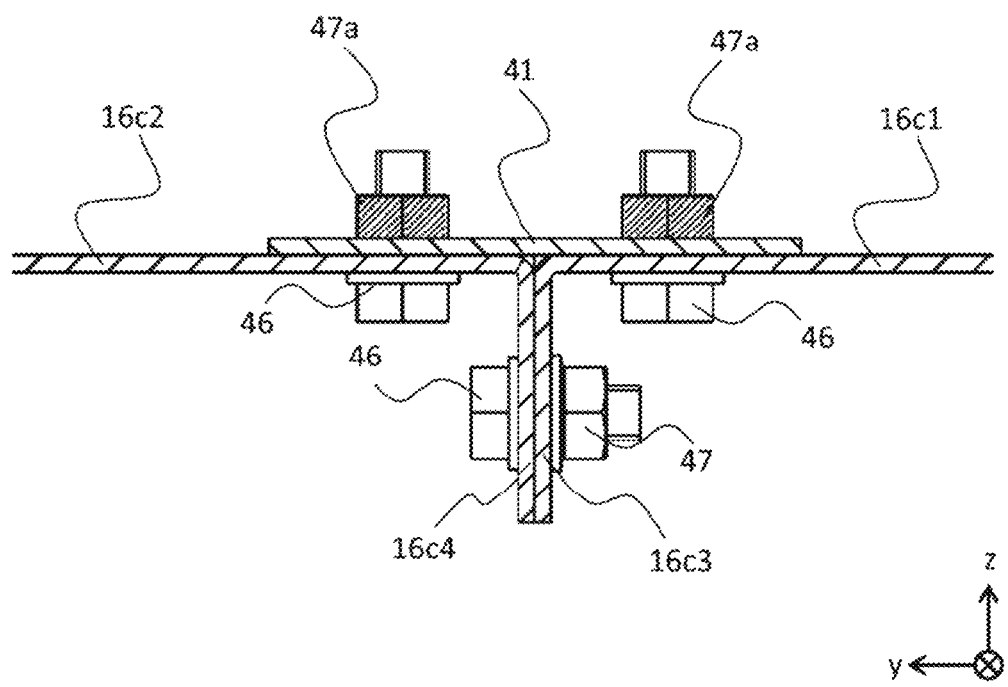
Figure 7:
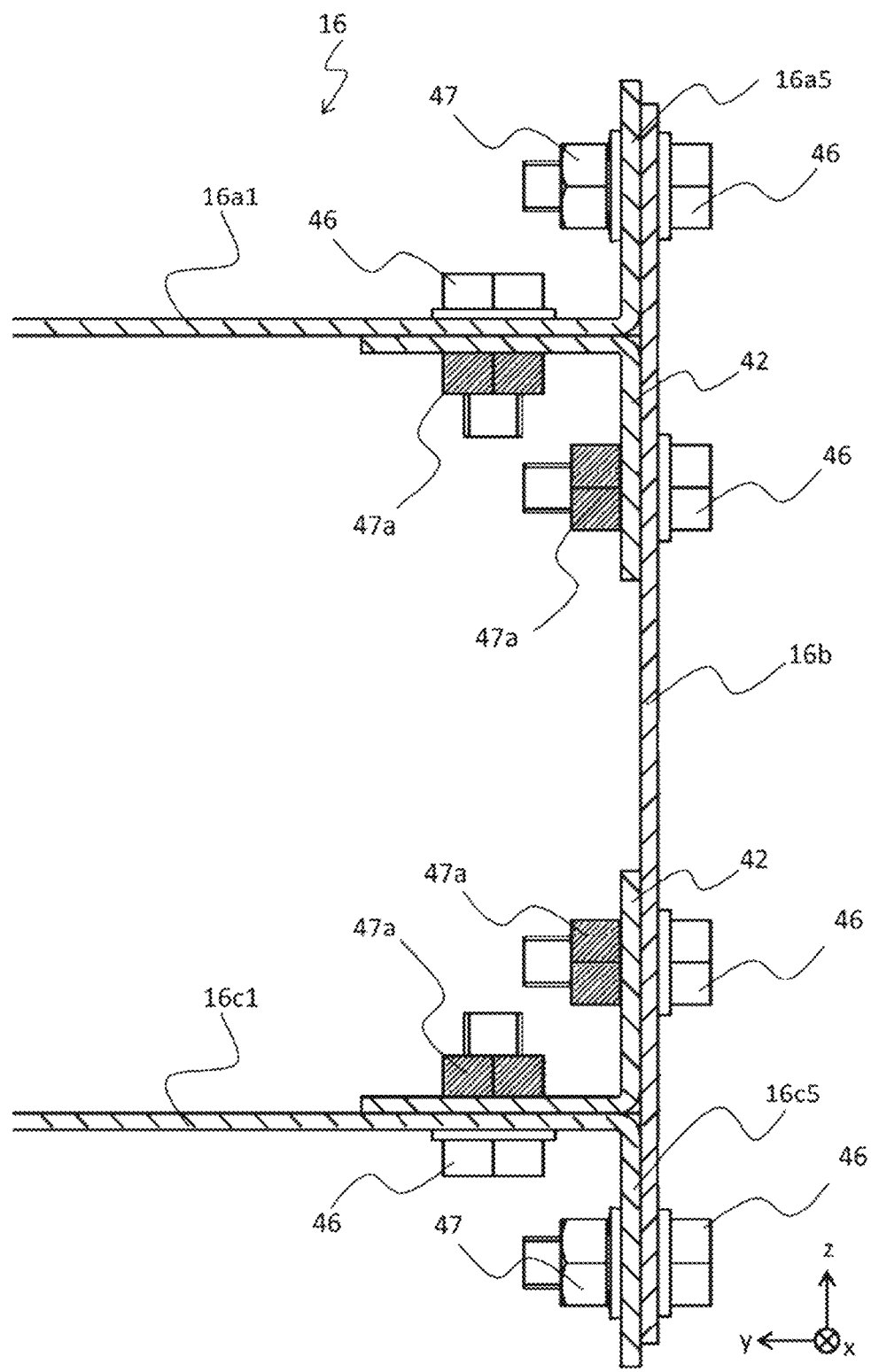
FIG. 7 is a detailed view of part D in FIG. 5 and shows joining portions between a front plate, and an upper plate and a lower plate, of the exhaust duct according to embodiment 1.

Next, the structure of the exhaust duct 16 will be described. FIG. 5 is a perspective view showing the exhaust duct according to embodiment 1, and FIG. 6 is a detailed view of part C in FIG. 5 and shows a joining portion between divided upper plates and a joining portion between divided lower plates of the exhaust duct. FIG. 7 is a detailed view of part D and shows joining portions between a front plate, and an upper plate and a lower plate, of the exhaust duct.

As shown in FIG. 5, the exhaust duct 16 has an upper plate 16a, a front plate 16b, a lower plate 16c, and a rear plate 16d extending in the x-direction and having side ends joined to each other so as to form a duct having a rectangular sectional shape. The upper plate 16a is divided in the y-direction into a divided upper plate 16a1 on the front side and a divided upper plate 16a2 on the rear side, and thus is composed of two divided upper plates (i.e., divided plates). Also, the lower plate 16c is divided in the y-direction into a divided lower plate 16c1 on the front side and a divided lower plate 16c2 on the rear side and thus is composed of two divided lower plates (i.e., divided plates).

The divided upper plates 16a1, 16a2 have joining portions 16a3, 16a4 (i.e., divided plate joining portions) at side ends that are opposed to each other as shown in FIG. 6. The joining portions 16a3, 16a4 are formed by raising the side ends of the divided upper plates 16a1, 16a2 into L shapes, and have bolt holes (not shown) at mutually corresponding positions. Under the joining portions 16a3, 16a4, an additional plate 41 is provided in contact with the inner surfaces of the divided upper plates 16a1, 16a2. The additional plate 41 and the divided upper plates 16a1, 16a2 have bolt holes (not shown) at mutually corresponding positions. Welding nuts 47a are welded on the inner surface side of the additional plate 41 at positions corresponding to the bolt holes. Joining between the divided upper plates 16a1, 16a2 is performed as follows. In a state in which opposed surfaces of the joining portions 16a3, 16a4 are brought into contact with each other, the bolt 46 is inserted through in the y-direction from the joining portion 16a4 side so as to be screwed to the nut 47 on the joining portion 16a3 side, and the bolts 46 are inserted through in the z-direction from the divided upper plate 16a1, 16a2 side so as to be screwed to the welding nuts 47a on the additional plate 41. Thus, the divided upper plates 16a1, 16a2 are joined by being fastened and fixed in two fastening directions with use of three pairs of fastening members.

Similarly, regarding the divided lower plates 16c1, 16c2, joining portions 16c3, 16c4 formed by raising side ends that are opposed to each other into L shapes are fastened and fixed by bolts 46 and nuts 47, and the divided lower plates 16c1, 16c2 and an additional plate 41 provided above the joining portions 16c3, 16c4 so as to be in contact with the inner surfaces of the divided lower plates 16c1, 16c2 are fastened and fixed to each other. Thus, the divided lower plates 16c1, 16c2 are also fastened and fixed in two fastening directions by three pairs of fastening members, and thereby joined to each other. In embodiment 1, the two fastening directions are the y-direction and the z-direction and thus are perpendicular to each other. However, the two fastening directions may be directions crossing each other. The upper plate 16a and the lower plate 16c are respectively divided into two divided upper plates and two divided lower plates. However, the division number may be three or more. Plates that are divided are not limited to the upper plate 16a and the lower plate 16c. The front plate 16b and the rear plate 16d may be divided.

The front side ends of the divided upper plate 16a1 and the divided lower plate 16c1 are respectively bent upward and downward as shown in FIG. 7, to form front plate joining portions 16a5, 16c5. The front plate joining portions 16a5, 16c5 and the front plate 16b have bolt holes (not shown) through which the bolts 46 are inserted, at mutually corresponding positions. An L-shaped additional plate 42 having a horizontal portion and a vertical portion is provided on the front under side of the divided upper plate 16a1. The horizontal portion of the L-shaped additional plate 42 is in contact with the inner surface of the divided upper plate 16a1, and the vertical portion thereof is in contact with the inner surface of the front plate 16b. The divided upper plate 16a1 and the horizontal portion of the L-shaped additional plate 42 have bolt holes (not shown) through which the bolt 46 is inserted, at mutually corresponding positions. The front plate 16b and the vertical portion of the L-shaped additional plate 42 have bolt holes (not shown) through which the bolt 46 is inserted, at mutually corresponding positions. On the inner surface sides of the vertical portion and the horizontal portion of the L-shaped additional plate, the welding nuts 47a are welded at positions corresponding to the bolt holes.

Joining between the front plate 16b, and the divided upper plate 16a1 and the divided lower plate 16c1, is performed as follows. In a state in which the outer surfaces of the front plate joining portions 16a5, 16c5 are each brought into contact with the inner surface of the front plate 16b, the bolts 46 are inserted through in the y-direction from the front plate 16b side, so as to be screwed to the nuts 47 on the inner surface side of the front plate joining portions 16a5, 16c5. In a state in which the horizontal portions of the L-shaped additional plates 42 are brought into contact with the divided upper plate 16a1 and the divided lower plate 16c1, the bolts 46 are inserted through in the z-direction, so as to be screwed to the welding nuts 47a welded on the horizontal portions of the L-shaped additional plates 42, and in addition, in a state in which the vertical portions of the L-shaped additional plates 42 are brought into contact with the front plate 16b, the bolts 46 are inserted through in the y-direction from the front plate 16b side, so as to be screwed to the welding nuts 47a welded on the vertical portions of the L-shaped additional plates 42. As described above, the divided upper plate 16a1 and the divided lower plate 16c1 are directly fastened and fixed to the front plate 16b by the bolts 46 and the nuts 47, and are also fastened and fixed to the L-shaped additional plates 42 fastened and fixed to the front plate 16b by the bolts 46 and the welding nuts 47a, whereby the divided upper plate 16a1 and the divided lower plate 16c1 are also indirectly fixed to the front plate 16b. Thus, the front plate 16b, and the divided upper plate 16a1 and the divided lower plate 16c1, are joined by their side ends being fastened and fixed in two fastening directions with use of three pairs of fastening members.

Here, joining between the front plate 16b, and the divided upper plate 16a1 and the divided lower plate 16c1, has been described above. The same applies to the case of joining between the rear plate 16d, and the divided upper plate 16a2 and the divided lower plate 16c2. Here, the two fastening directions are the y-direction and the z-direction and thus are perpendicular to each other. However, the two fastening directions are not limited to directions perpendicular to each other, but may be directions crossing each other.

Figure 8:
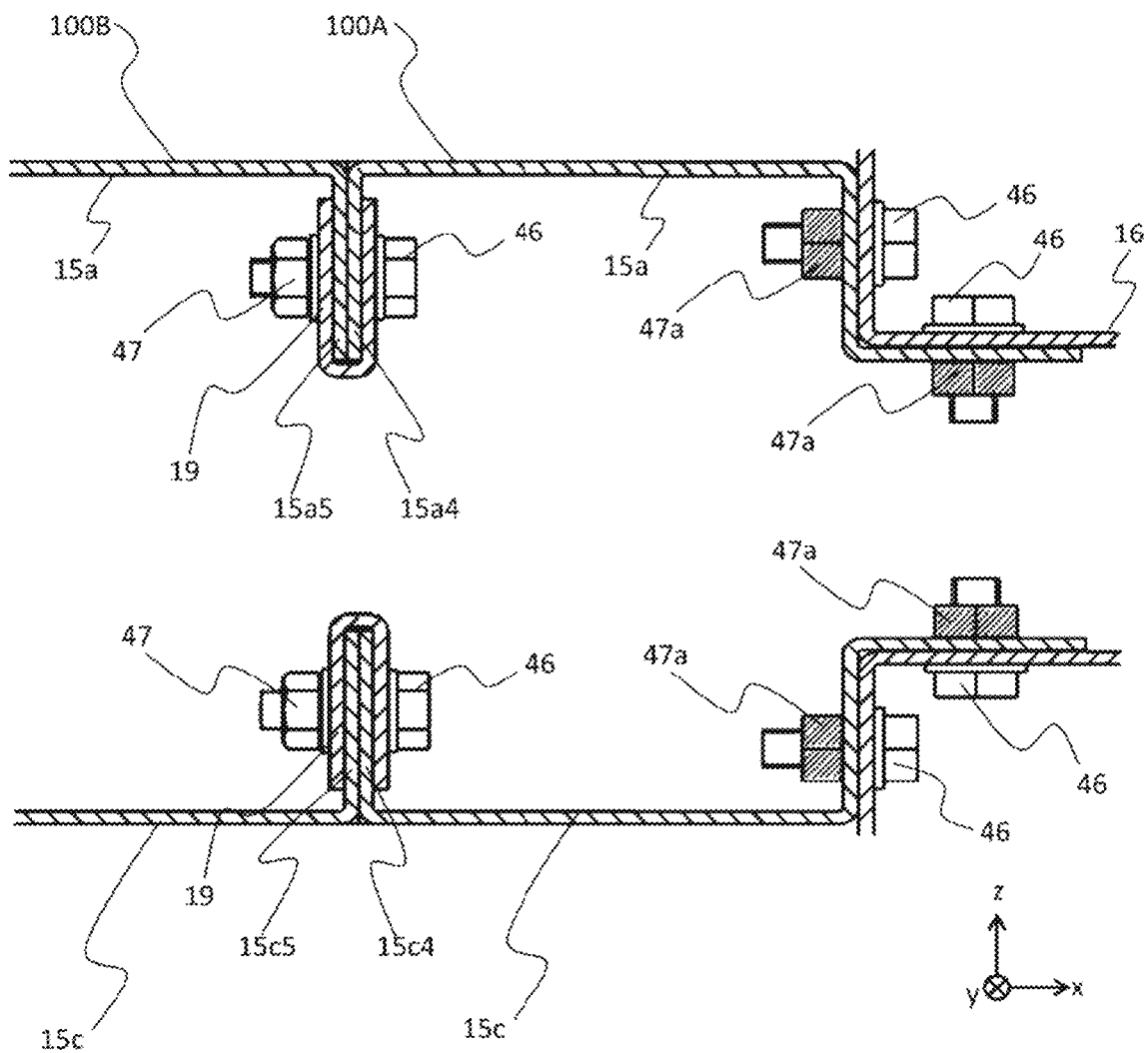
FIG. 8 is a sectional view showing the structure of connection portions between the common ducts according to embodiment 1 of the present invention.

Next, connection between the common ducts will be described. FIG. 8 is a sectional view showing the structure of connection portions between the common ducts provided to the respective switchgears adjacent to each other, and shows the connection portions between the common duct 15 of the switchgear 100B and the common duct 15 of the switchgear 100A. The common ducts 15 of the switchgears adjacent to each other are connected by joining plates composing the respective common ducts. In FIG. 8, joining of the upper plates and the lower plates is described. The same applies to the case of joining of the front plates and the rear plates. As shown in FIG. 8, of the common duct 15 of the switchgear 100A, the upper plate 15a and the lower plate 15c are bent at the end on the switchgear 100B side toward the inside of the duct, to form a joining portion 15a4 and a joining portion 15c4. In addition, of the common duct 15 of the switchgear 100B, the upper plate 15a and the lower plate 15c are bent at the end on the switchgear 100A side toward the inside of the duct, to form a joining portion 15a5 and a joining portion 15c5. The joining portions 15a4, 15a5, 15c4, 15c5 have bolt holes (not shown) through which bolts 46 are inserted.

The joining portion 15a4 and the joining portion 15a5 are grasped by a U-shaped additional plate 19 from the lower side with their outer surfaces in contact with each other. The U-shaped additional plate 19 has bolt holes (not shown) at positions corresponding to the bolt holes of the joining portion 15a4 and the joining portion 15a5, and the inner surface of the U-shaped additional plate 19 is in contact with the joining portion 15a4 and the joining portion 15a5. The U-shaped additional plate 19 and the joining portions 15a4, 15a5 are fastened and fixed by the bolt 46 inserted through from the switchgear 100A side and screwed to the nut 47 on the switchgear 100B side. The joining portion 15a4 and the joining portion 15a5 are joined by being fastened and fixed together with the U-shaped additional plate 19 as described above. Similarly, regarding the lower plates 15c, the joining portion 15c4 and the joining portion 15c5 are grasped by a U-shaped additional plate 19 from the upper side with their outer surfaces in contact with each other, and are joined by being fastened and fixed together with the U-shaped additional plate 19 with use of the bolt 46 and the nut 47.

By joining the upper plates 15a and joining the lower plates 15c as described above, the connection portions between the common duct 15 on the switchgear 100A side and the common duct 15 on the switchgear 100B side are fixed without gaps, whereby high-temperature high-pressure gas can be prevented from leaking out from the joining portions between the common ducts.

Figure 9:
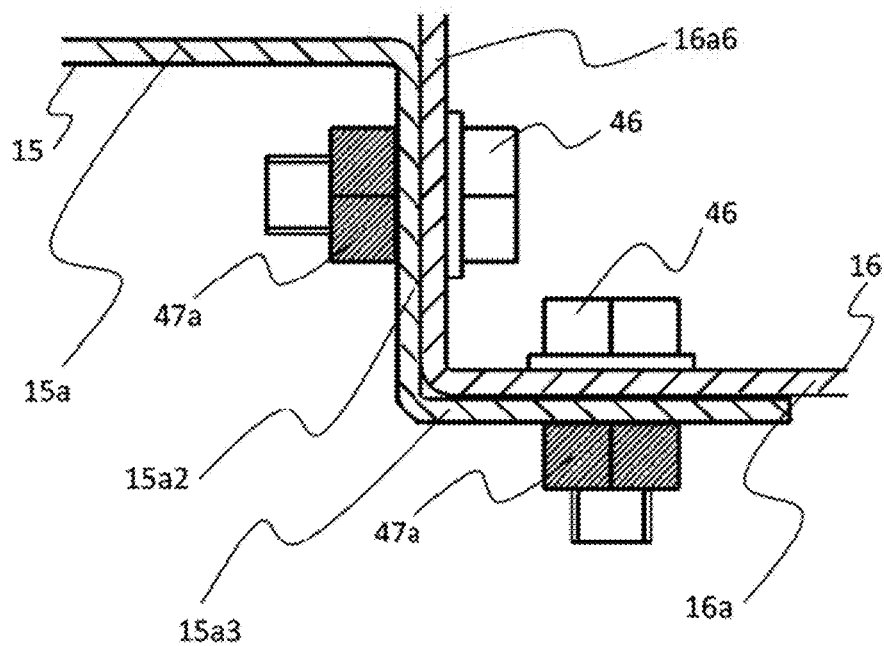
FIG. 9 is a sectional view showing the structure of connection portions between the common duct and the exhaust duct according to embodiment 1 of the present invention.
Figure 9:
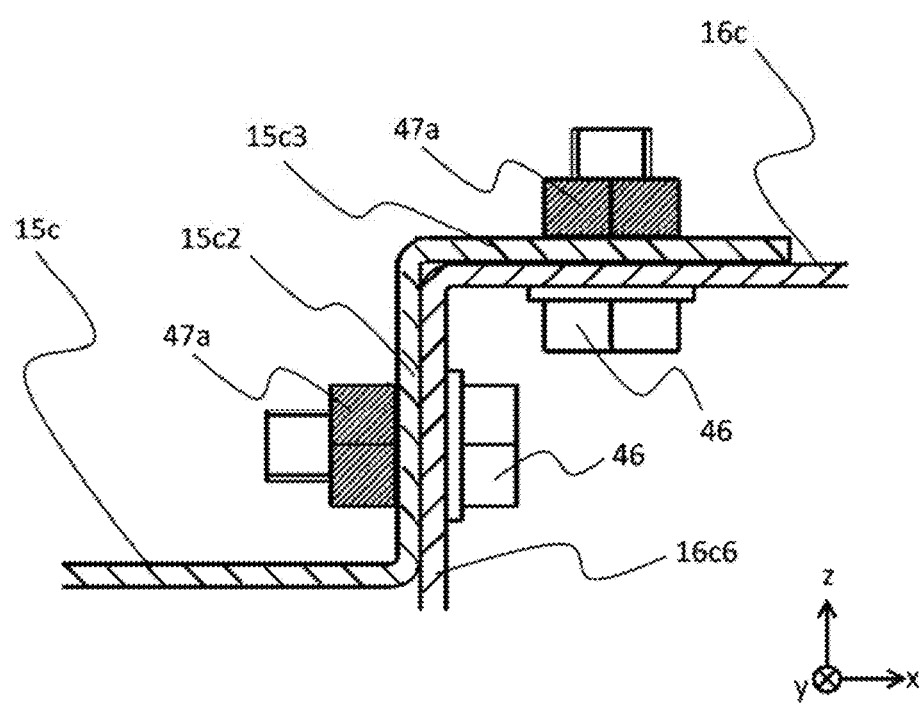

Next, connection between the common duct and the exhaust duct will be described. FIG. 9 is a sectional view showing the structure of connection portions between the common duct and the exhaust duct. The common duct 15 and the exhaust duct 16 are connected by joining plates composing the respective ducts. In FIG. 9, joining of the upper plates and the lower plates is described. The same applies to the case of joining of the front plates and the rear plates. As shown in FIG. 9, the end on the exhaust duct 16 side of the upper plate 15a of the common duct 15 is bent toward the inside of the duct, to form a first exhaust duct joining portion 15a2 (i.e., first joining portion), and the end of the first exhaust duct joining portion 15a2 is bent toward the exhaust duct 16 side, to form a second exhaust duct joining portion 15a3 (i.e., third joining portion). In addition, the end on the common duct 15 side of the upper plate 16a of the exhaust duct 16 is bent toward the outside of the duct, to form a common duct joining portion 16a6 (i.e., second joining portion). The outer surface of the first exhaust duct joining portion 15a2 and the inner surface of the common duct joining portion 16a6 are in contact with each other, and the outer surface of the second exhaust duct joining portion 15a3 and the inner surface of the upper plate 16a are in contact with each other. The first exhaust duct joining portion 15a2 and the common duct joining portion 16a6, and the second exhaust duct joining portion 15a3 and the upper plate 16a, have bolt holes (not shown) at mutually corresponding positions. On the inner surface of the first exhaust duct joining portion 15a2 and the inner surface of the second exhaust duct joining portion 15a3, the welding nuts 47a are welded at positions corresponding to the bolt holes. The first duct has a first fluid flow cross-sectional area. The second duct has a second fluid flow cross-sectional area. The first fluid flow cross-sectional area is reduced at a connection portion.

Joining between the upper plate 15a of the common duct 15 and the upper plate 16a of the exhaust duct 16 is performed as follows. In a state in which the inner surface of the common duct joining portion 16a6 and the outer surface of the first exhaust duct joining portion 15a2 are brought into contact with each other, the bolt 46 is inserted through in the x-direction from the common duct joining portion 16a6 side, so as to be screwed to the welding nut 47a welded on the first exhaust duct joining portion 15a2, and in addition, in a state in which the inner surface of the upper plate 16a of the exhaust duct 16 and the outer surface of the second exhaust duct joining portion 15a3 are brought into contact with each other, the bolt 46 is inserted through in the z-direction from the upper plate 16a side, so as to be screwed to the welding nut 47a welded on the second exhaust duct joining portion 15a3. The upper plate 15a of the common duct 15 and the upper plate 16a of the exhaust duct 16 are joined by their connection portions being fastened and fixed in two fastening directions with use of two pairs of fastening members as described above.

Similarly, regarding the lower plate 15c and the lower plate 16c, in a state in which the outer surface of a first exhaust duct joining portion 15c2 and the inner surface of a common duct joining portion 16c6 are brought into contact with each other and the outer surface of a second exhaust duct joining portion 15c3 and the inner surface of the lower plate 16c are brought into contact with each other, the bolt 46 is inserted through in the x-direction from the common duct joining portion 16c6 side so as to be screwed to the welding nut 47a welded on the lower plate 15c, and the bolt 46 is inserted through in the z-direction from the lower plate 16c side so as to be screwed to the welding nut 47a welded on the second exhaust duct joining portion 15c3. The lower plate 15c of the common duct 15 and the lower plate 16c of the exhaust duct 16 are joined by their connection portions being fastened and fixed with use of two pairs of fastening members as described above.

In embodiment 1, two pairs of fastening members are used. However, the fastening and fixation only have to be made in two fastening directions using two or more pairs of fastening members. Therefore, three or more pairs of fastening members may be used. Here, the two fastening directions are the x-direction and the z-direction and thus are perpendicular to each other. However, the two fastening directions may be directions crossing each other.

Figure 10:
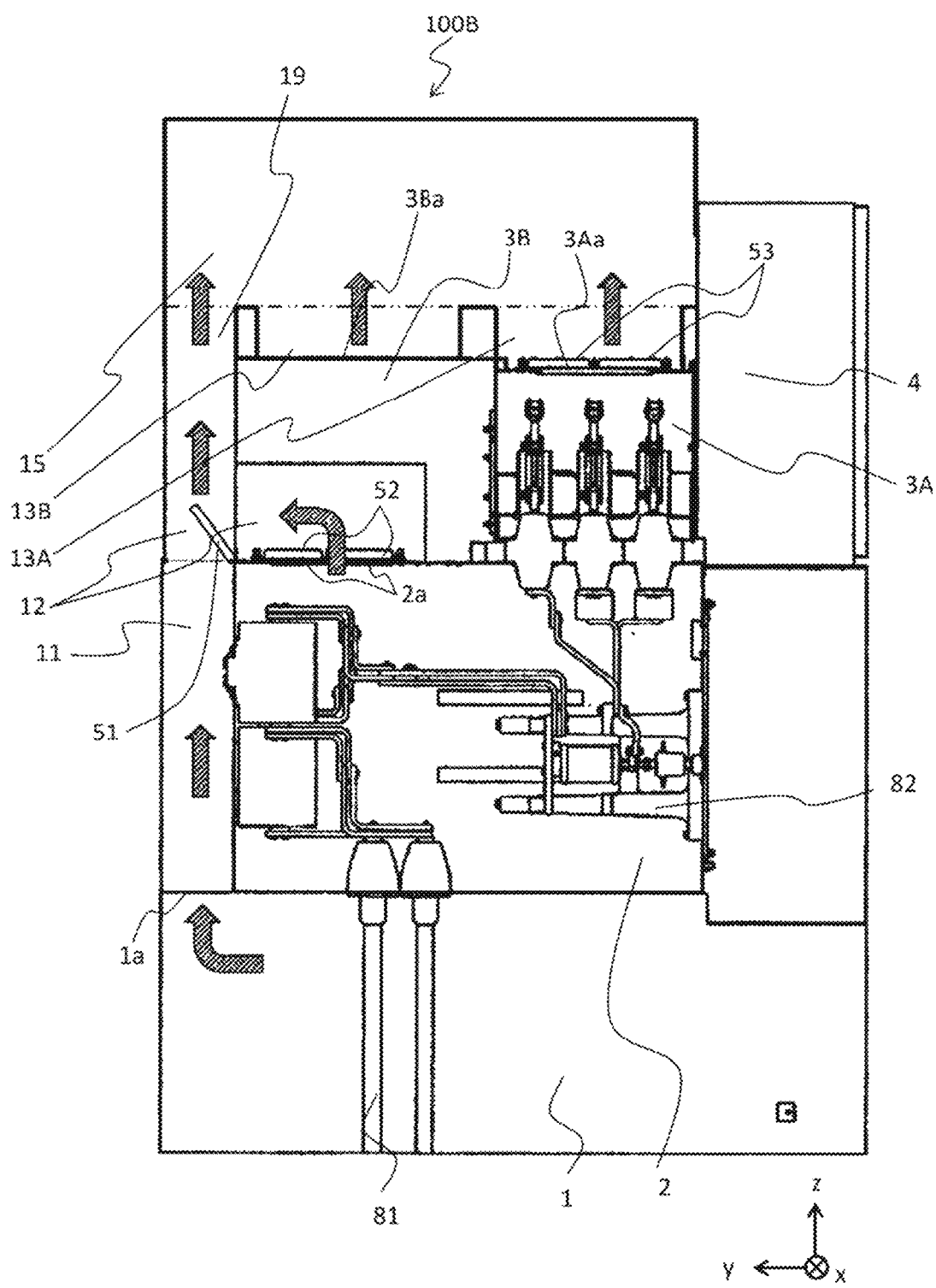
FIG. 10 is a side sectional view showing flow of high-temperature high-pressure gas in the switchgear.
Figure 11:
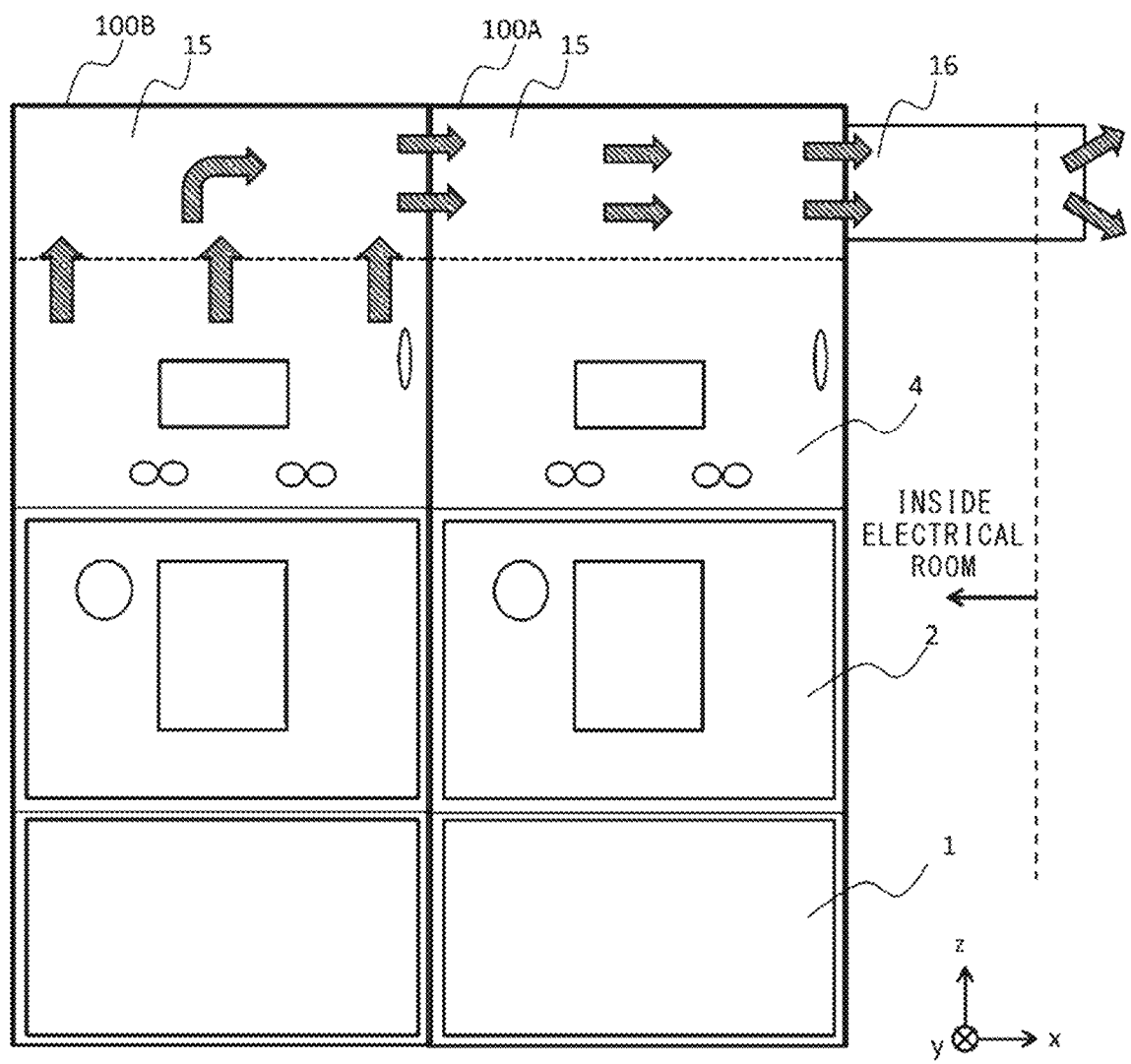
FIG. 11 is a front view showing flow of high-temperature high-pressure gas in the switchgears.

Next, operation will be described. FIG. 10 is a side sectional view showing flow of high-temperature high-pressure gas in the switchgear, and FIG. 11 is a front view showing flow of high-temperature high-pressure gas in the switchgears. Arrows in FIG. 10 and FIG. 11 indicate flow of high-temperature high-pressure gas when an arc fault has occurred, and the case where an arc fault has occurred in the switchgear 100B is shown here.

In the case where an arc fault has occurred in the cable chamber 1, as shown in FIG. 10, high-temperature high-pressure gas generated in the cable chamber 1 flows into the cable chamber pressure release duct 11 from the opening 1a. Thereafter, the high-temperature high-pressure gas opens the cable chamber pressure release plate 51 upward by the pressure thereof, and then passes through the circuit breaker chamber pressure release duct 12 and flows into the common duct 15. As shown in FIG. 11, the high-temperature high-pressure gas having flowed into the common duct 15 flows inside the common duct 15 toward the switchgear 100A located at the end of the arrangement, and then passes through the common duct 15 of the switchgear 100A and flows into the exhaust duct 16. The high-temperature high-pressure gas having flowed into the exhaust duct 16 flows therethrough in the x-direction, to be discharged to outside of the electrical room.

In the case where an arc fault has occurred in the circuit breaker chamber 2, high-temperature high-pressure gas generated in the circuit breaker chamber 2 opens the circuit breaker chamber pressure release plate 52 by the pressure thereof, and flows into the circuit breaker chamber pressure release duct 12 from the opening 2a. Then, the high-temperature high-pressure gas flows inside the circuit breaker chamber pressure release duct 12, to flow into the common duct 15. The subsequent flow is the same as in the case where an arc fault has occurred in the cable chamber 1. In the case where an arc fault has occurred in the front bus chamber 3A or the rear bus chamber 3B, high-temperature high-pressure gas generated in the front bus chamber 3A or the rear bus chamber 3B opens the bus chamber pressure release plate 53 by the pressure thereof, and flows into the front bus chamber pressure release duct 13A or the rear bus chamber pressure release duct 13B from the opening 3Aa or 3Ba. Then, the high-temperature high-pressure gas flows inside the front bus chamber pressure release duct 13A or the rear bus chamber pressure release duct 13B, to flow into the common duct 15. The subsequent flow is the same as in the case where an arc fault has occurred in the cable chamber 1. In the case where an arc fault has occurred in the switchgear 100A, the only difference is that high-temperature high-pressure gas flows directly into the exhaust duct 16 from the common duct 15, and except for this, the flow is the same as in the case where an arc fault has occurred in the switchgear 100B. It is noted that the above also applies to the case of an internal short-circuit fault.

The high-temperature high-pressure gas generated in the cable chamber 1 passes through the circuit breaker chamber pressure release duct 12 as described above, and there is a possibility that the high-temperature high-pressure gas having reached the common duct 15 might flow into the circuit breaker chamber pressure release duct 12, the front bus chamber pressure release duct 13A, or the rear bus chamber pressure release duct 13B. However, the cable chamber pressure release plate 51, the circuit breaker chamber pressure release plate 52, and the bus chamber pressure release plates 53 do not open by pressure from the upper side. Therefore, high-pressure gas generated in one compartment does not flow into another compartment. In addition, high-temperature high-pressure gas flowing in from the adjacent switchgear 100B via the common duct 15 does not flow into any compartment.

In embodiment 1, at the connection portion between the common duct penetrating through the plurality of arranged switchgears and the exhaust duct via which the common duct and outside of the electrical room communicate with each other, each plate composing the common duct is bent inward to form an exhaust duct joining portion, and each plate composing the exhaust duct is bent outward to form a common duct joining portion. Then, in a state in which the outer surface of the exhaust duct joining portion and the inner surface of the common duct joining portion are brought into contact with each other, the common duct joining portion and the exhaust duct joining portion are fastened and fixed by two or more pairs of fastening members, whereby the respective plates are joined to each other. Therefore, deformation due to heat and pressure of high-temperature high-pressure gas can be suppressed, and airtightness of a discharge path for high-temperature high-pressure gas generated upon an arc fault or an internal short-circuit fault is ensured, whereby a highly reliable switchgear can be obtained.

In addition, each plate of the common duct and each plate of the exhaust duct are fastened and fixed to each other in two fastening directions crossing each other. Therefore, even when high pressure is applied in a specific direction, deformation can be suppressed, and thus airtightness can be enhanced.

In addition, the common duct and the exhaust duct are joined by their plates being fastened and fixed in two fastening directions crossing each other with use of two or more pairs of fastening members. Thus, airtightness between the common duct and the exhaust duct can be enhanced.

In addition, in the exhaust duct, the divided upper plates and the divided lower plates forming the upper plate and the lower plate are fastened and fixed in two fastening directions perpendicular to each other owing to the additional plates provided inside of the duct at their mutual joining portions. Therefore, deformation at the joining portions of the divided upper plates and the divided lower plates is suppressed, and thus airtightness of the exhaust duct can be ensured.

In addition, the welding nuts are welded inside the common duct and the exhaust duct. Therefore, in assembling, it is only required to insert bolts from outside and screw the bolts to the welding nuts. Thus, assembly work is facilitated.

Embodiment 2

Figure 12:
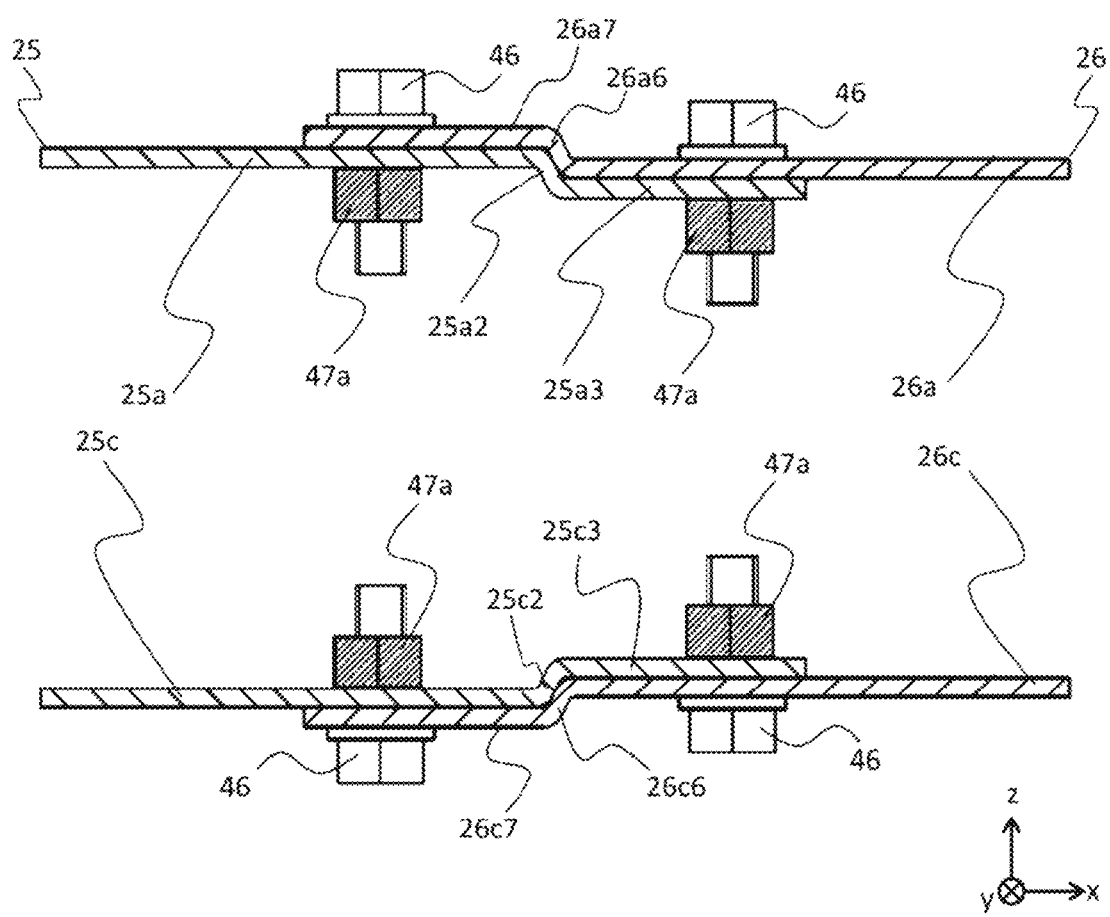
FIG. 12 is a sectional view showing the structure of connection portions between a common duct and an exhaust duct according to embodiment 2 of the present invention.

Hereinafter, embodiment 2 of the present invention will be described with reference to FIG. 12. Embodiment 2 is different from embodiment 1 in the connection portions between the common duct and the exhaust duct. FIG. 12 is a sectional view showing the structure of the connection portions between the common duct and the exhaust duct in embodiment 2. In FIG. 12, joining of the upper plates and the lower plates is described. The same applies to the case of joining of the front plates and the rear plates. As shown in FIG. 12, the end on the exhaust duct 26 side of an upper plate 25a of a common duct 25 is bent toward the inside of the duct, to form a first exhaust duct joining portion 25a2, and the end of the first exhaust duct joining portion 25a2 is bent toward the exhaust duct 26 side, to form a second exhaust duct joining portion 25a3. In addition, the end on the common duct 25 side of an upper plate 26a of the exhaust duct 26 is bent toward the outside of the duct, to form a common duct joining portion 26a6, and the end of the common duct joining portion 26a6 is bent toward the common duct 25 side, to form a second common duct joining portion 26a7 (i.e., fourth joining portion). The outer surface of the upper plate 25a and the inner surface of the second common duct joining portion 26a7 are in contact with each other, the outer surface of the first exhaust duct joining portion 25a2 and the inner surface of the common duct joining portion 26a6 are in contact with each other, and the outer surface of the second exhaust duct joining portion 25a3 and the inner surface of the upper plate 26a are in contact with each other. The second common duct joining portion 26a7 and the upper plate 25a, and the second exhaust duct joining portion 25a3 and the upper plate 26a, have bolt holes (not shown) at mutually corresponding positions. On the inner surface of the second exhaust duct joining portion 25a3 and the inner surface of the upper plate 25a, welding nuts 47a are welded at positions corresponding to the bolt holes.

Joining between the upper plate 25a of the common duct 25 and the upper plate 26a of the exhaust duct 26 is performed as follows. In a state in which the inner surface of the second common duct joining portion 26a7 and the outer surface of the upper plate 25a are brought into contact with each other, the bolt 46 is inserted through in the z-direction from the second common duct joining portion 26a7 side, so as to be screwed to the welding nut 47a welded on the upper plate 25a, and in addition, in a state in which the inner surface of the upper plate 26a of the exhaust duct 26 and the outer surface of the second exhaust duct joining portion 25a3 are brought into contact with each other, the bolt 46 is inserted through in the z-direction from the upper plate 26a side, so as to be screwed to the welding nut 47a welded on the second exhaust duct joining portion 25a3. The upper plate 25a of the common duct 25 and the upper plate 26a of the exhaust duct 26 are joined by their connection portions being fastened and fixed with use of two pairs of fastening members as described above.

Similarly, regarding a lower plate 25c and a lower plate 26c, in a state in which the outer surface of the lower plate 25c and the inner surface of a second common duct joining portion 26c7, the outer surface of a first exhaust duct joining portion 25c2 and the inner surface of a common duct joining portion 26c6, and the outer surface of a second exhaust duct joining portion 25c3 and the inner surface of the lower plate 26c, are brought into contact with each other, the bolt 46 is inserted through in the z-direction from the second common duct joining portion 26c7 side, so as to be screwed to the welding nut 47a welded on the lower plate 25c, and the bolt 46 is inserted through in the z-direction from the lower plate 26c side, so as to be screwed to the welding nut 47a welded on the second exhaust duct joining portion 25c3. The lower plate 25c of the common duct 25 and the lower plate 26c of the exhaust duct 26 are joined by their connection portions being fastened and fixed with use of two pairs of fastening members as described above.

The plates only have to be fastened and fixed using two or more pairs of fastening members. Therefore, three or more pairs of fastening members may be used.

The other matters are the same as in embodiment 1.

In embodiment 2, as in embodiment 1, the connection portion between the common duct and the exhaust duct is joined by being fastened and fixed with use of two or more pairs of fastening members. Therefore, deformation due to heat and pressure of high-temperature high-pressure gas can be suppressed. Thus, airtightness of a discharge path for high-temperature high-pressure gas generated upon an arc fault or an internal short-circuit fault is ensured, whereby a highly reliable switchgear can be obtained.

In addition, the second common duct joining portion bent toward the common duct side is provided to the exhaust duct, the second common duct joining portion and the plate of the common duct are joined to each other, and the second exhaust duct joining portion and the plate of the exhaust duct are joined to each other. Therefore, the first exhaust duct joining portion and the common duct joining portion are not fastened and fixed by fastening members. Thus, the dimensions of the first exhaust duct joining portion and the common duct joining portion can be reduced, so that the difference between the sectional area of the common duct and the sectional area of the exhaust duct can be reduced. As a result, gas pressure increase in the exhaust duct and reverse flow due to the gas pressure increase can be prevented, high airtightness can be maintained, and durability of the joining portions between the common duct and the exhaust duct can be improved.

Embodiment 3

Figure 13:
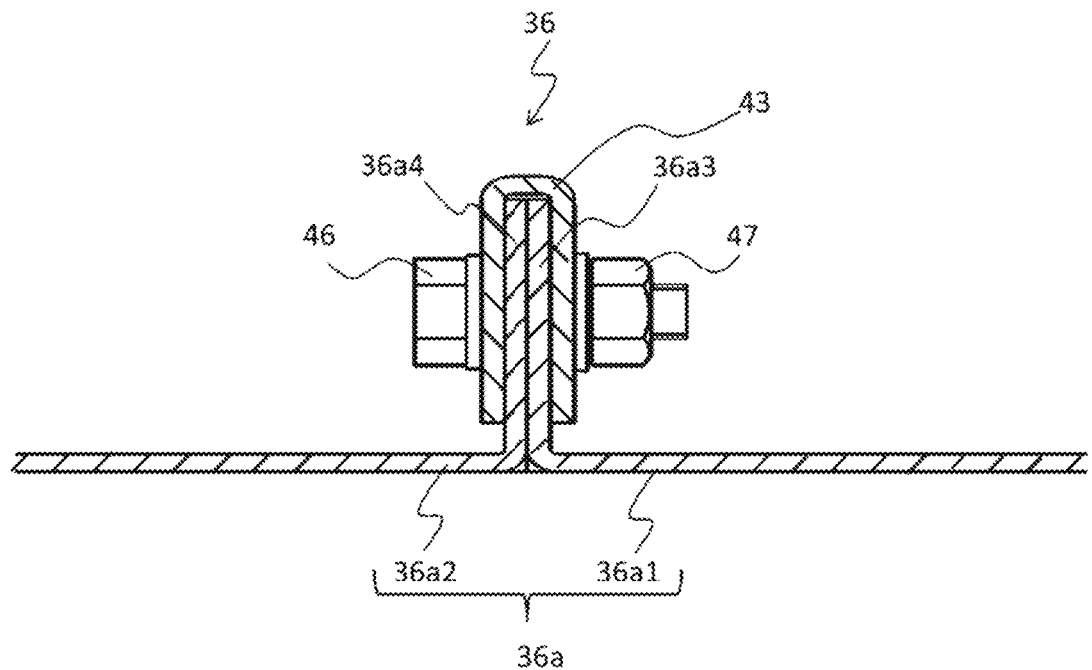
FIG. 13 is a sectional view showing the structure of an upper plate and a lower plate of an exhaust duct according to embodiment 3 of the present invention.
Figure 13:
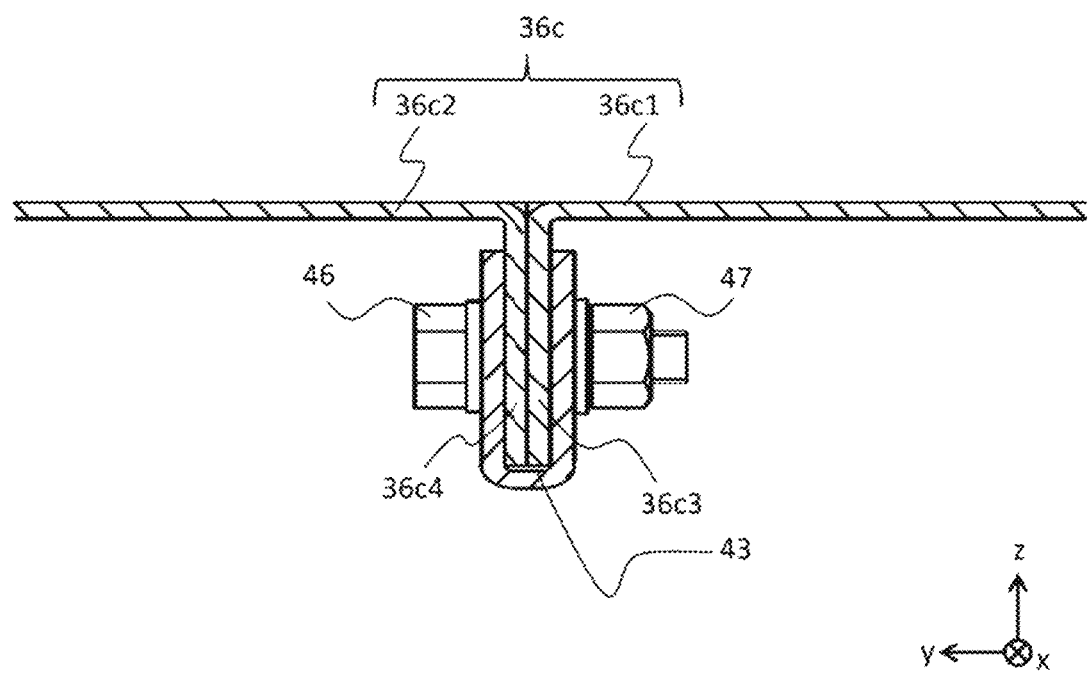

Hereinafter, embodiment 3 of the present invention will be described with reference to FIG. 13. Embodiment 3 is different from embodiment 1 in the joining portions of the divided upper plates and the divided lower plates of the exhaust duct. FIG. 13 is a sectional view showing the structure of the upper plate and the lower plate of the exhaust duct according to embodiment 3. As shown in FIG. 13, divided upper plates 36a1, 36a2 composing an upper plate 36a of an exhaust duct 36 have joining portions 36a3, 36a4 at side ends that are opposed to each other. The joining portions 36a3, 36a4 are formed by raising the side ends of the divided upper plates 36a1, 36a2 into L shapes, and have bolt holes (not shown) at mutually corresponding positions. The joining portions 36a3, 36a4 are grasped by a U-shaped additional plate 43 (i.e., a grasping member) from the upper side with their outer surfaces in contact with each other. The inner surface of the U-shaped additional plate 43 is in contact with the joining portions 36a3, 36a4, and has bolt holes at positions corresponding to the bolt holes of the joining portions 36a3, 36a4. The U-shaped additional plate 43 and the divided upper plates 36a1, 36a2 are fastened and fixed by the bolt 46 inserted through in the y-direction from the joining portion 36a4 side and screwed to the nut 47 on the joining portion 36a3 side. The divided upper plates 36a1, 36a2 are joined by being fastened and fixed together with the U-shaped additional plate 43 grasping the joining portions 36a3, 36a4 with use of fastening members as described above. Similarly, regarding divided lower plates 36c1, 36c2 composing a lower plate 36c, joining portions 36c3, 36c4 formed by raising side ends that are opposed to each other into L shapes are grasped by a U-shaped additional plate 43 from the lower side with their outer surfaces in contact with each other. The divided lower plates 36c1, 36c2 are joined by being fastened and fixed together with the U-shaped additional plate 43 grasping the joining portions 36c3, 36c4 with use of fastening members.

The other matters are the same as in embodiment 1, and therefore the description thereof is omitted.

In embodiment 3, the same effects as in embodiment 1 can be obtained.

In addition, in joining of the divided upper plates and the divided lower plates of the exhaust duct, the joining portions formed by being raised in L shapes are grasped by U-shaped additional plates, and the joining portions are fastened and fixed together with the U-shaped additional plates, whereby the divided upper plates and the divided lower plates are joined. Therefore, only one pair of fastening members are needed for each of joining of the divided upper plates and joining of the divided lower plates, and it is possible to perform joining of the divided upper plates and the divided upper plates through only work outside the exhaust duct without using welding nuts inside the duct.

It is noted that, within the scope of the present invention, the above embodiments may be freely combined with each other. In addition, each of the above embodiments may be modified or simplified as appropriate.

DESCRIPTION OF THE REFERENCE CHARACTERS 1 cable chamber
2 circuit breaker chamber
3A front bus chamber
3B rear bus chamber
11 cable chamber pressure release duct
12 circuit breaker chamber pressure release duct
13A front bus chamber pressure release duct
13B rear bus chamber pressure release duct
15, 25 common duct
15a, 25a upper plate
15a1 front plate joining portion
15a2, 25a2 first exhaust duct joining portion
15a3, 25a3 second exhaust duct joining portion
15b front plate
15b1 upper and lower plate joining portions
15c, 25c lower plate
15c1 front plate joining portion
15c2, 25c2 first exhaust duct joining portion
15c3, 25c3 second exhaust duct joining portion
15d rear plate
16, 26, 36 exhaust duct
16a, 26a, 36a upper plate
16a1, 16a2, 36a1, 36a2 divided upper plate
16a3, 16a4, 36a3, 36a4 joining portion
16a5 front plate joining portion
16a6, 26a6 common duct joining portion
26a7 second common duct joining portion
16b front plate
16c, 26c, 36c lower plate
16c1, 16c2, 36c1, 36c2 divided lower plate
16c3, 16c4, 36c3, 36c4 joining portion
16c5 front plate joining portion
16c6, 26c6 common duct joining portion
26c7 second common duct joining portion
16d rear plate
41 additional plate
42 L-shaped additional plate
43 U-shaped additional plate
46 bolt
47 nut
47a welding nut
100A, 100B switchgear

The invention claimed is:
1. A switchgear including switchgears which are arranged in an arrangement direction inside an electrical room and each of which has a plurality of compartments therein, comprising:
at least one pressure release duct;
a first duct which penetrates through the switchgears in the arrangement direction and communicates with each of the plurality of compartments via the at least one pressure release duct, the first duct having a first fluid flow cross-sectional area; and a second duct via which the first duct and outside of the electrical room communicate with each other, the second duct having a second fluid flow cross-sectional area wherein the first fluid flow cross-sectional area is reduced at a connection portion, wherein at the connection portion between the first duct and the second duct, an end of the first duct is bent inward to form a first joining portion, at the connection portion between the first duct and the second duct, an end of the second duct is bent outward to form a second joining portion, and in a state in which an outer surface of the first joining portion and an inner surface of the second joining portion are in contact with each other, the first joining portion and the second joining portion are fastened and fixed by a first two or more pairs of fastening members, the first joining portion and the second joining portion are fastened and fixed in two fastening directions crossing each other, and passing through the first duct and the second duct wherein the fastening members are composed of welding nuts welded on inner surfaces of the first duct and the second duct, and bolts, wherein a first bolt of the bolts is inserted through the first duct in a first fastening direction of the two fastening directions and secured to a respective welding nut of the welding nuts, and a second bolt of the bolts is inserted through the second duct in a second fastening direction of the two fastening directions and secured to another welding nut of the welding nuts.

2. The switchgear according to claim 1, wherein
the first joining portion is bent toward a second duct side to form a third joining portion that comes into contact with an inner surface of the second duct,
the second joining portion is bent toward a first duct side to form a fourth joining portion that comes into contact with an outer surface of the first duct, and
the third joining portion and the second duct are fastened and fixed to each other, and the fourth joining portion and the first duct are fastened and fixed to each other.

3. The switchgear according to claim 2, wherein
plates forming respective surfaces of the first duct are fastened and fixed to each other by another two or more pairs of fastening members.

4. The switchgear according to claim 3, wherein
plates forming respective surfaces of the second duct are fastened and fixed to each other by another two or more pairs of fastening members.

5. The switchgear according to claim 2, wherein
plates forming respective surfaces of the second duct are fastened and fixed to each other by another two or more pairs of fastening members.

6. The switchgear according to claim 1, wherein
plates forming respective surfaces of the first duct are fastened and fixed to each other by another two or more pairs of fastening members.

7. The switchgear according to claim 6, wherein
plates forming respective surfaces of the second duct are fastened and fixed to each other by another two or more pairs of fastening members.

8. The switchgear according to claim 6, wherein
the plates forming the respective surfaces of the first duct are fastened and fixed in two fastening directions crossing each other.

9. The switchgear according to claim 1, wherein
plates forming respective surfaces of the second duct are fastened and fixed to each other by another two or more pairs of fastening members.

10. The switchgear according to claim 9, wherein
the plates forming the respective surfaces of the second duct are fastened and fixed in two fastening directions crossing each other.

11. The switchgear according to claim 1, wherein
the second duct is formed such that plates forming respective surfaces thereof are each divided into a plurality of divided plates which are joined to each other via divided plate joining portions formed by raising ends of the plurality of divided plates.

12. The switchgear according to claim 11, wherein
the plurality of divided plates are fastened and fixed to each other in two or more pairs of fastening directions crossing each other.

13. The switchgear according to claim 11, wherein
the plurality of divided plates are fastened and fixed such that the divided plate joining portions are grasped by a grasping member and a fastening member penetrates through the grasping member and the divided plate joining portions.

14. The switchgear according to claim 1, wherein
the first fastening direction of the two fastening directions is an axial direction of the first duct and the second fastening direction of the two fastening directions is a radial direction of the first duct.

* * * * *